United States Patent
Furuhata et al.

(10) Patent No.: US 9,977,098 B2
(45) Date of Patent: May 22, 2018

(54) MRI WITH AUTOMATIC ADJUSTMENT OF IMAGING CONDITIONS TO NOT EXCEED SAR AND SAE LIMITS

(71) Applicant: TOSHIBA MEDICAL SYSTEMS CORPORATION, Otawara-Shi, Tochigi-Ken (JP)

(72) Inventors: Kentarou Furuhata, Tochigi (JP); Masashi Ookawa, Tochigi (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 715 days.

(21) Appl. No.: 14/515,869

(22) Filed: Oct. 16, 2014

(65) Prior Publication Data

US 2015/0102811 A1   Apr. 16, 2015

(30) Foreign Application Priority Data

Oct. 16, 2013   (JP) .................. 2013-215683

(51) Int. Cl.
G01V 3/00 (2006.01)
G01R 33/28 (2006.01)
G01R 33/54 (2006.01)
G01R 33/56 (2006.01)

(52) U.S. Cl.
CPC ......... G01R 33/288 (2013.01); G01R 33/543 (2013.01); *G01R 33/5601* (2013.01)

(58) Field of Classification Search
CPC . G01R 33/288; G01R 33/543; G01R 33/5601

USPC ........................................... 324/318
See application file for complete search history.

(56) References Cited

U.S. PATENT DOCUMENTS

| | | | | |
|---|---|---|---|---|
| 7,355,404 B1* | 4/2008 | Hariharan | | G01R 33/543 324/307 |
| 8,115,485 B1* | 2/2012 | Maier | | G01R 33/543 324/307 |
| 2004/0199069 A1* | 10/2004 | Connelly | | G01R 33/285 600/412 |
| 2005/0054913 A1* | 3/2005 | Duerk | | G01R 33/287 600/423 |
| 2007/0096735 A1* | 5/2007 | Morich | | G01R 33/583 324/318 |
| 2011/0109312 A1* | 5/2011 | Yamanaka | | G01R 33/288 324/309 |
| 2011/0118587 A1* | 5/2011 | Roemer | | G01R 33/022 600/411 |
| 2012/0139541 A1* | 6/2012 | Weiss | | G01R 33/583 324/318 |
| 2012/0197106 A1* | 8/2012 | Cloos | | G01R 33/246 600/411 |
| 2012/0262174 A1* | 10/2012 | Voigt | | G01R 33/246 324/309 |

(Continued)

FOREIGN PATENT DOCUMENTS

JP   2012-157458   8/2012

*Primary Examiner* — Susan Lee
(74) *Attorney, Agent, or Firm* — Nixon & Vanderhye P.C.

(57) ABSTRACT

Magnetic resonance imaging (MRI) is configured to carry out sequential imaging, to acquire an actual SAR measurement value at a predetermined timing during the sequential imaging, and to update a subsequent predicted SAE value each time the actual SAR measurement value is acquired.

11 Claims, 9 Drawing Sheets

(56) References Cited

U.S. PATENT DOCUMENTS

2013/0023753 A1* 1/2013 Kawamura ............ A61B 5/055
600/410

* cited by examiner

MRI WITH AUTOMATIC ADJUSTMENT OF IMAGING CONDITIONS TO NOT EXCEED SAR AND SAE LIMITS

CROSS-REFERENCE TO RELATED APPLICATION

This application is based upon and claims the benefit of priority from Japanese Patent Application No. 2013-215683, filed on Oct. 16, 2013, the entire contents of which are incorporated herein by reference.

FIELD

An exemplary embodiment of the present invention relates to an MRI apparatus.

BACKGROUND

A magnetic resonance imaging (MRI) apparatus is an imaging apparatus which excites nuclear spins of a patient placed in a static magnetic field with a radio frequency (RF) signal at Larmor frequency and thereby generates an image by reconstructing a magnetic resonance signal generated from the patient as a result of the excitation.

As the MRI apparatus applies the radio-frequency signal (RF signal) to the patient to obtain the magnetic resonance signal, temperature of the patient is raised. Thus, in relation to imaging by means of the MRI apparatus, from the standpoint of safety, a specific absorption ratio (SAR) has been defined as energy absorbed per unit mass of the patient and an upper limit of SAR, i.e., a safety standard value of SAR, has been prescribed as an IEC (International Electrotechnical Commission) standard (IEC 60601-2-33). More specifically, SAR (unit: W/kg) is defined as energy of the RF signal absorbed by 1 kg of living tissue, and upper limits of average SAR over arbitrary 10 seconds (hereinafter referred to simply as a 10-second average SAR) and average SAR over the most recent 6 minutes (hereinafter referred to simply as a 6-minute average SAR) have been prescribed for each imaging site such as the whole body or the head.

Since the upper limit of SAR has been prescribed for each body site as described above, a SAR calculation method for each body site has been provided.

Also, for examinations based on an MRI apparatus, there is an imaging method which acquires detailed diagnostic images by increasing contrast of a tumor or target site using a contrast medium. Such examinations using a contrast medium have a problem of difficulty to determine whether the contrast medium has reached a destination.

Thus, an MRI apparatus has been provided which carries out imaging at a desired destination of a contrast medium in advance before injection of the contrast medium, takes scans successively after injection of the contrast medium, and automatically starts imaging when signal strength at the destination of the contrast medium increases.

In relation to imaging by means of the MRI apparatus, in addition to the 10-second average SAR and 6-minute average SAR described above, an upper limit of long MR examination specific absorbed energy has been prescribed as well. The long MR examination specific absorbed energy is a sum total of SAR per examination, i.e., a cumulative value or integration value of SAR per examination. The IEC standard prescribes that when the upper limit of the long MR examination specific absorbed energy is exceeded, imaging must not be carried out any more. Hereinafter the long MR examination specific absorbed energy will be referred to simply as SAE (Specific Absorbed Energy).

In an examination using a contrast medium, when imaging (hereinafter referred to as monitoring imaging) is carried out by continuously applying an RF signal and displaying reconstructed images to conduct observation, unless values of SAR and SAE (long MR examination specific absorbed energy) are controlled properly based on the safety standard values, the examination has to be stopped halfway even if the contrast medium has not reached its destination. Furthermore, even if the contrast medium reaches its destination by means of the monitoring imaging, there remains a problem of being unable to carry out imaging (hereinafter referred to as main imaging) intended to collect images subsequently.

Also, recently, a treatment and examination method known as interventional MRI has been attracting attention because of low invasiveness, where the method involves inserting a catheter or puncture needle into a subject or performing a medical operation such as an endoscopic surgery while carrying out imaging. The interventional MRI involves carrying out imaging continuously using an MRI apparatus, as during verification of contrast medium injection, while performing treatment activities such as medical procedures (hereinafter, the sequential imaging which involves treatment activities will be referred to as interventional imaging). Therefore, unless rises in body temperature, i.e., increases in the SAR and SAE (long MR examination specific absorbed energy) described above, are controlled properly, there can arise a situation in which imaging has to be stopped halfway through a medical procedure.

Thus, there is demand for an MRI apparatus which automatically adjusts imaging conditions such that upper limits of SAR and SAE (long MR examination specific absorbed energy) values will not be exceeded when monitoring imaging or interventional imaging is carried out using the MRI apparatus.

DETAILED DESCRIPTION

An MRI apparatus according to an exemplary embodiment of the present invention will be described below with reference to the accompanying drawings.

To solve the above-described problems, An MRI apparatus comprising: an imaging unit configured to carry out sequential imaging; an SAR acquisition unit configured to acquire an actual SAR measurement value at a predetermined timing during the sequential imaging; and a prediction unit configured to update a subsequent predicted SAE value each time the actual SAR measurement value is acquired.

(1) Configuration

Figure 1:
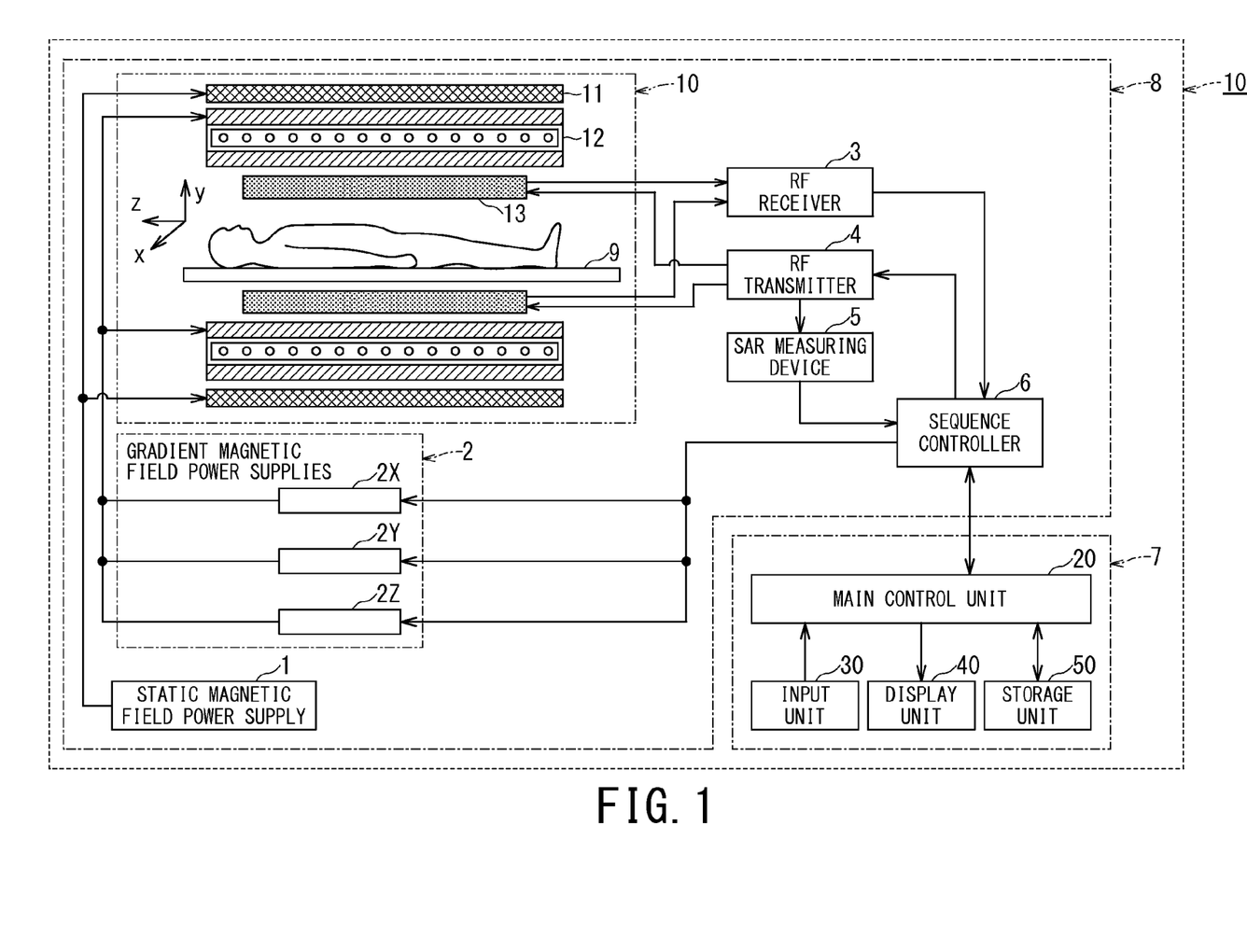
FIG. 1 is a conceptual configuration diagram showing an example of the MRI apparatus according to the present exemplary embodiment.

FIG. 1 is a conceptual configuration diagram showing an example of the MRI apparatus according to the present exemplary embodiment. As shown in FIG. 1, the MRI apparatus 100 according to the exemplary embodiment includes an imaging unit 8 and a computer 7. The imaging unit 8 includes a static magnetic field power supply 1 adapted to generate a static magnetic field, gradient magnetic field power supplies 2 (2X, 2Y, 2Z) adapted to add location information to the static magnetic field, a RF receiver 3 and RF transmitter 4 adapted to receive and transmit a radio-frequency signal, an SAR measuring device 5, a sequence controller 6 adapted to execute a predetermined pulse sequence, a bed unit 9 used to place a subject (patient) on, and a magnet gantry system 10. The computer 7 is configured to control the entire MRI apparatus 100.

The magnet gantry system 10 includes a static magnet 11, a gradient coil 12, an RF coil 13, and the like and these components are contained in a gantry approximately cylindrical in shape. In the case of carrying out imaging by means of interventional MRI described later, the gantry may be configured to be an open gantry by providing an opening in a wall of the magnet gantry system 10, allowing a user such as a surgeon to access the subject.

The static magnet 11 of the magnet gantry system 10 generates a static magnetic field in a bore (space in a cylinder of the static magnet 11), which is an imaging area for the subject. The static magnet 11, which contains a superconducting coil, generates the static magnetic field in an energization mode by applying an electric current supplied from the static magnetic field power supply 1 to the superconducting coil. Subsequently, upon transfer into a persistent current mode, the static magnetic field power supply 1 is cut off. The static magnet 11 has its superconducting coil cooled to cryogenic temperatures by liquid helium, which maintains a heat shield at low temperatures, causing the heat shield to keep inner part of the static magnet 11 at cryogenic temperatures.

The gradient coil 12 is also approximately cylindrical in shape and is fixed to an inner side of the static magnet 11. The gradient coil 12 applies gradient magnetic fields in X-axis, Y-axis, and Z-axis directions based on electric currents supplied from the gradient magnetic field power supplies 2 (2X, 2Y, 2Z).

The SAR measuring device 5 measures an amount of energy (SAR) absorbed by the subject, based on the RF signal actually outputted by the RF transmitter 4. The measured SAR is transmitted to the computer 7 via the sequence controller 6.

The sequence controller 6 controls imaging conditions of the MRI apparatus 100. The sequence controller 6 controls imaging sequences of monitoring imaging, main imaging, interventional imaging, and the like. The monitoring imaging, which is carried out, for example, to verify injection of a contrast medium, involves sequential imaging and reconstruction of images. On the other hand, the main imaging is carried out after the contrast medium reaches its destination. Besides, even if no contrast medium is used, imaging carried out to observe targeted site successively is also included in the monitoring imaging. The interventional imaging involves carrying out sequential imaging and reconstruction of images while performing medical procedures such as insertion of a catheter or puncture needle. An imaging method, such as the above-described monitoring imaging and interventional imaging, which involves imaging a subject continuously, will be referred to as sequential imaging. Note that although the MRI apparatus 100 is described as an example in the present exemplary embodiment, sequential imaging is carried out not only by the MRI apparatus 100, but also by an X-ray apparatus and X-ray CT (Computed Tomography) apparatus. The imaging sequences described above are executed when the sequence controller 6 controls the RF receiver 3, RF transmitter 4, and the like according to preset imaging conditions or according to imaging conditions entered via an input unit 30 of the computer 7.

The computer 7 includes a main control unit 20, an input unit 30, a display unit 40, a storage unit 50, and the like in its internal structure. The computer 7 stores imaging conditions set for sequential imaging in the storage unit 50, and when a program stored in the storage unit 50 is executed by the main control unit 20 equipped with a processor, the sequence controller 6 executes a sequence according to the set imaging conditions.

Also, the main control unit 20 executes a program stored in the storage unit 50, thereby calculates RF signal energy (SAR: Specific Absorption Ratio) and the like absorbed by 1 kg of living tissue based on set imaging conditions and actual SAR measurement values and requests the sequence controller 6 to change the imaging conditions such that imaging will be carried out in compliance with safety standards. Also, the computer 7 acquires data from the RF transmitter 4 via the SAR measuring device 5 and sequence controller 6, and then the main control unit 20 executes an image reconstruction program, corresponding to various image calculations, stored in the storage unit 50 and thereby generates reconstructed images subjected to the image calculations.

The storage unit 50 is made up of storage media including a RAM and ROM, which are magnetic, optical, or semiconductor memory storage media readable by the main control units 20.

The input unit 30 includes, for example, typical input devices such as a keyboard, a touch panel, a numerical keypad, a mouse, and the like.

The display unit 40 is made up, for example, of a typical display device such as a liquid crystal display or OLED (Organic Light Emitting Diode) display and adapted to display calculated average SAR, SAE, and reconstructed images under control of the main control unit 20.

Figure 2:
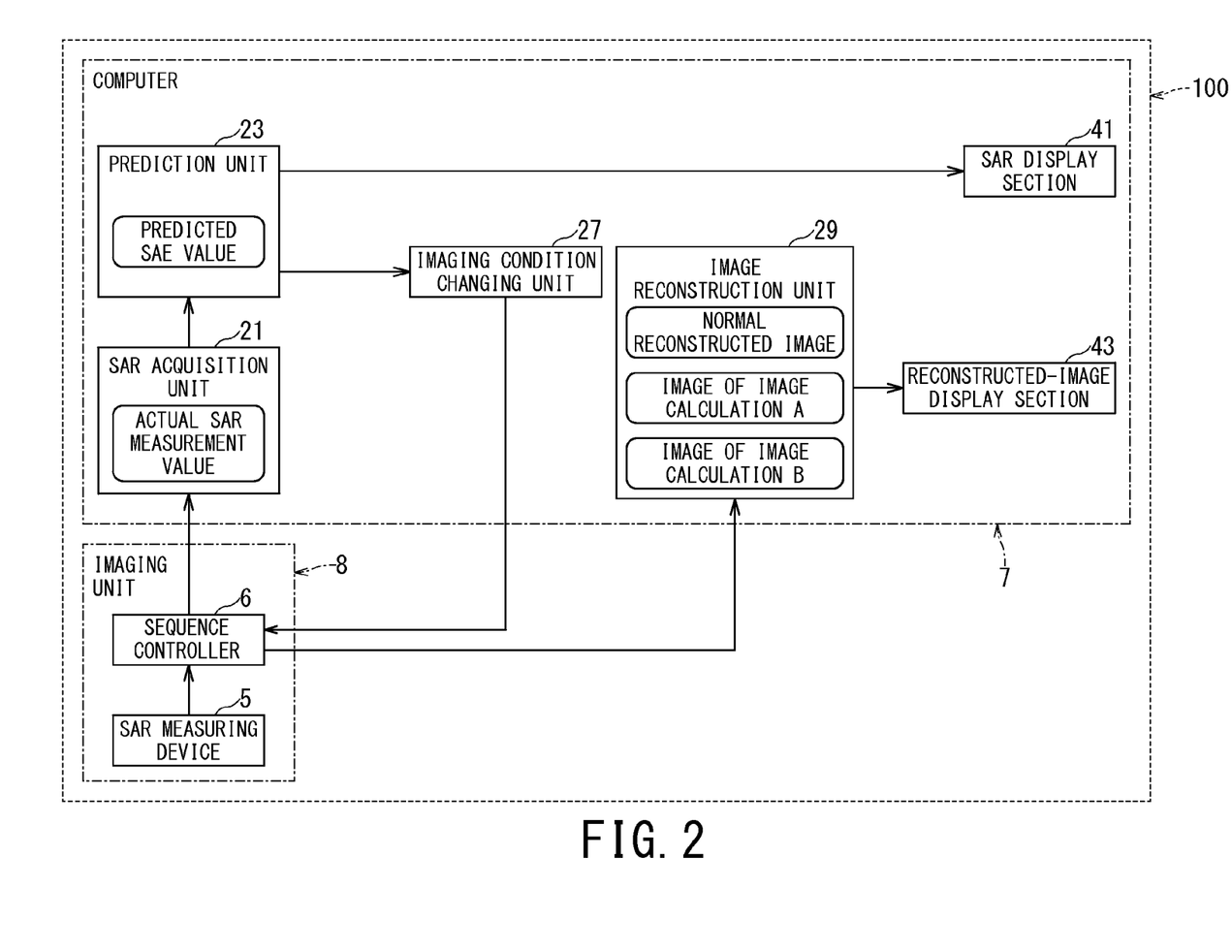
FIG. 2 is a functional block diagram showing an exemplary functional configuration of the MRI apparatus according to the exemplary embodiment.

FIG. 2 is a functional block diagram showing an exemplary functional configuration of the MRI apparatus 100 according to the exemplary embodiment. As shown in FIG. 2, the MRI apparatus 100 includes an SAR acquisition unit 21, a prediction unit 23, an imaging condition changing unit 27, an image reconstruction unit 29, an SAR display section 41, and a reconstructed-image display section 43. Of these, the SAR acquisition unit 21, prediction unit 23, imaging condition changing unit 27, and image reconstruction unit 29 are functions implemented when a program stored in the storage unit 50 is executed by the main control unit 20.

The SAR acquisition unit 21 acquires actual SAR measurement values at a predetermined timing during sequential imaging. The SAR acquisition unit 21 acquires the actual SAR measurement values taken by the SAR measuring device 5, via the sequence controller 6 while imaging is being carried out by the imaging unit 8. The SAR acquisition unit 21 calculates a 6-minute average actual SAR measurement value, 10-second average actual SAR measurement value, and actual SAE measurement value, respectively. The 6-minute average actual SAR measurement value, 10-second average actual SAR measurement value, and actual SAE measurement value are calculated based on the actual SAR measurement values acquired by the SAR acquisition unit 21. The 6-minute average actual SAR measurement value is an average value of the actual SAR measurement values acquired by the SAR acquisition unit 21, over the most recent 6 minutes. Similarly, the 10-second average actual SAR measurement value is an average value of the actual SAR measurement values acquired by the SAR acquisition unit 21, over the most recent 10 seconds. The actual SAE measurement value is an integrated value of the actual SAR measurement values acquired by the SAR acquisition unit 21, being integrated beginning with the start of the examination.

The prediction unit 23 updates a subsequent predicted SAE value each time an actual SAR measurement value is acquired.

The prediction unit 23 calculates the predicted SAE value after a lapse of a predetermined time and updates any predicted SAE value already calculated with a predicted value newly calculated.

The imaging condition changing unit 27 changes an imaging condition for sequential imaging. The imaging condition changing unit 27 changes the imaging condition based on the predicted SAE value calculated by the prediction unit 23. For example, the imaging condition changing unit 27 changes the imaging condition such that the predicted SAE value calculated by the prediction unit 23 will not exceed upper limit specified by the safety standard.

Note that there are plural parameters which determine the imaging condition. Of the plural parameters, a parameter selected in advance or a parameter selected by the user is changed. Alternatively, the imaging condition after a change is determined in advance, and the imaging condition changing unit 27 changes to the prepared imaging condition when it is determined that a change is necessary. Once the imaging condition is changed by the imaging condition changing unit 27, the sequence controller 6 controls a sequence based on the changed imaging condition. A method used by the imaging condition changing unit 27 to change imaging condition will be described later.

The SAR display section 41 displays an average SAR graph, SAE graph, imaging condition, and the like.

The image reconstruction unit 29 reconstructs images acquired by sequential imaging. The image reconstruction unit 29 changes an image calculation in response to a change made in the imaging condition by the imaging condition changing unit 27. The image calculation method will be described later.

The reconstructed-image display section 43 displays images generated by the image reconstruction unit 29.

(2) about Variations in SAR and SAE

Figure 3:
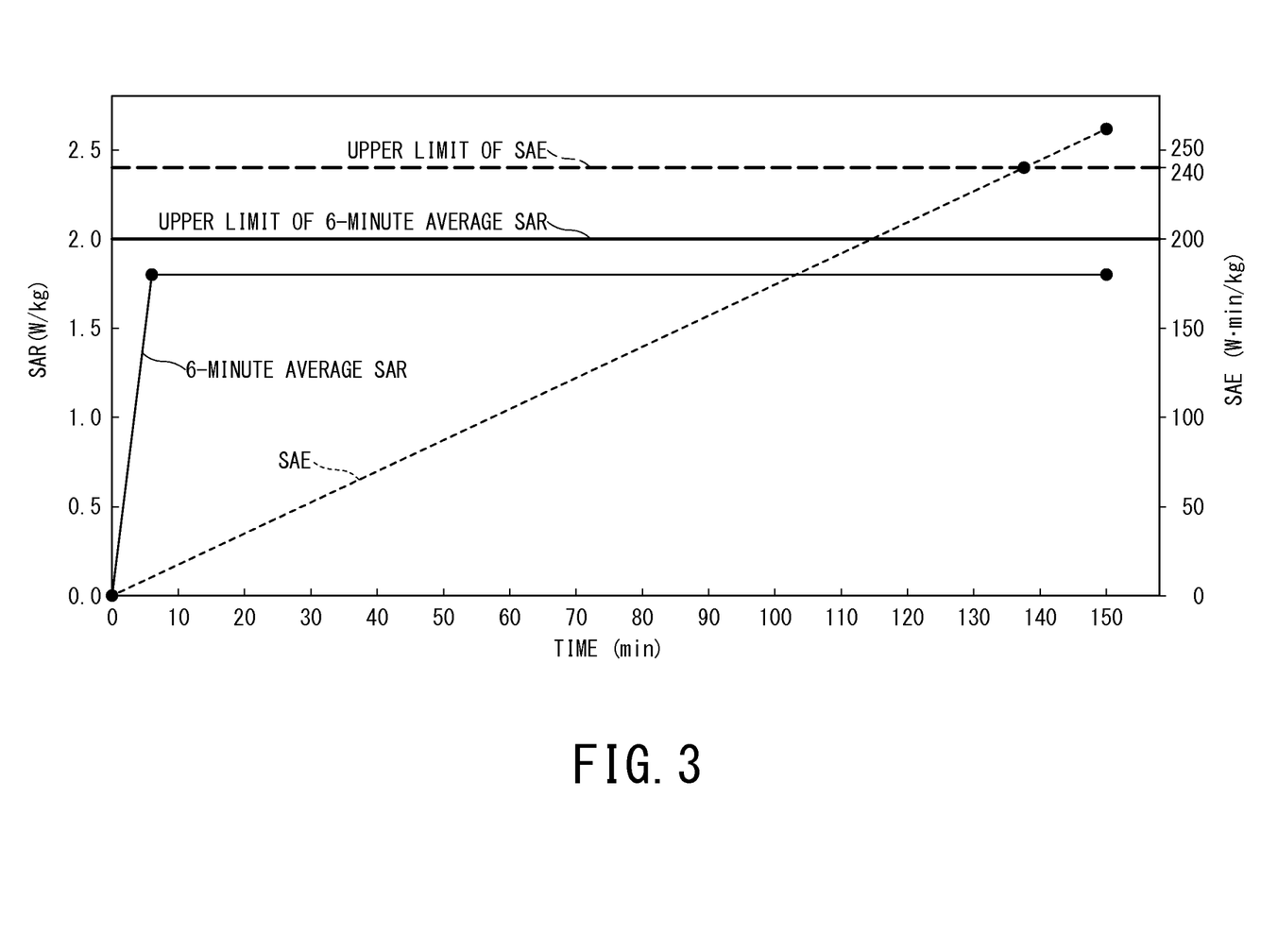
FIG. 3 is a diagram describing changes in average SAR and SAE during sequential imaging.

FIG. 3 is a diagram describing changes in average SAR and SAE during sequential imaging. In the graphs shown in FIG. 3, the abscissa represents time (minutes) and the ordinate on the left represents 6-minute average SAR (W/kg) while the ordinate on the right represents SAE (W×min/kg). In FIG. 3, a 6-minute average SAR graph is indicated by a solid line while an SAE graph is indicated by a broken line. An upper limit of the 6-minute average SAR is a value of 2.0 W/kg as indicated by the solid line and an upper limit of the SAE is a value of 240 W×min/kg as indicated by the broken line.

The graphs in FIG. 3 show results of imaging carried out for 150 minutes by keeping the imaging condition constant. As shown by the 6-minute average SAR graph indicated by the solid line in FIG. 3, a slope rises for 6 minutes from the start of imaging, but then becomes constant after a lapse of 6 minutes. The SAE graph indicated by a broken line in FIG. 3 rises at a constant slope from the start of imaging. As shown by the graphs of FIG. 3, during sequential imaging whereby imaging is carried out continuously, rises need to be monitored for up to 6 minutes after the imaging is started in the case of the 6-minute average SAR, and as long as the imaging continues in the case of the SAE. Note that although not illustrated in FIG. 3, when the imaging condition is changed halfway, the 6-minute average SAR graph varies in the slope for 6 minutes after the imaging condition is changed.

When the upper limit of 6-minute average SAR or upper limit of SAE shown in FIG. 3 is exceeded, imaging can no longer be continued, and a medical treatment has to be stopped halfway in some cases. For example, in the SAE graph of FIG. 3, a value of 240 W×min/kg, which is the upper limit of SAE, is exceeded after a lapse of 130 minutes. Thus, it can be seen that imaging cannot be continued for 130 minutes or more under the conditions shown in FIG. 3.

After the monitoring imaging carried out when a contrast medium is injected, it is necessary to carry out main imaging. Since the upper limit of SAE has been prescribed through an examination which involves monitoring imaging and main imaging, if SAE is close to its upper limit at a time of monitoring imaging intended to verify injection of the contrast medium, it may be impossible to carry out main imaging, which needs to be carried out at higher power than monitoring imaging.

On the other hand, in the case of interventional imaging which involves performing a medical procedure such as insertion of a catheter, the medical procedure has to be stopped halfway when the SAE upper limit is reached. Also, it is a heavy burden for the user such as the surgeon to manage increases in SAR and SAE while at the same time managing a state of the medical procedure, which can distract attention from the medical procedure.

Thus, the present invention provides the MRI apparatus 100 which can monitor increases in average SAR and SAE during sequential imaging and automatically adjust the imaging condition such that the upper limits of average SAR and SAE will not be exceeded.

(3) Operation

Description will be given below of a first embodiment which carries out monitoring imaging and main imaging by injecting a contrast medium and a second embodiment which carries out interventional imaging.

(First Embodiment)

Figure 4:
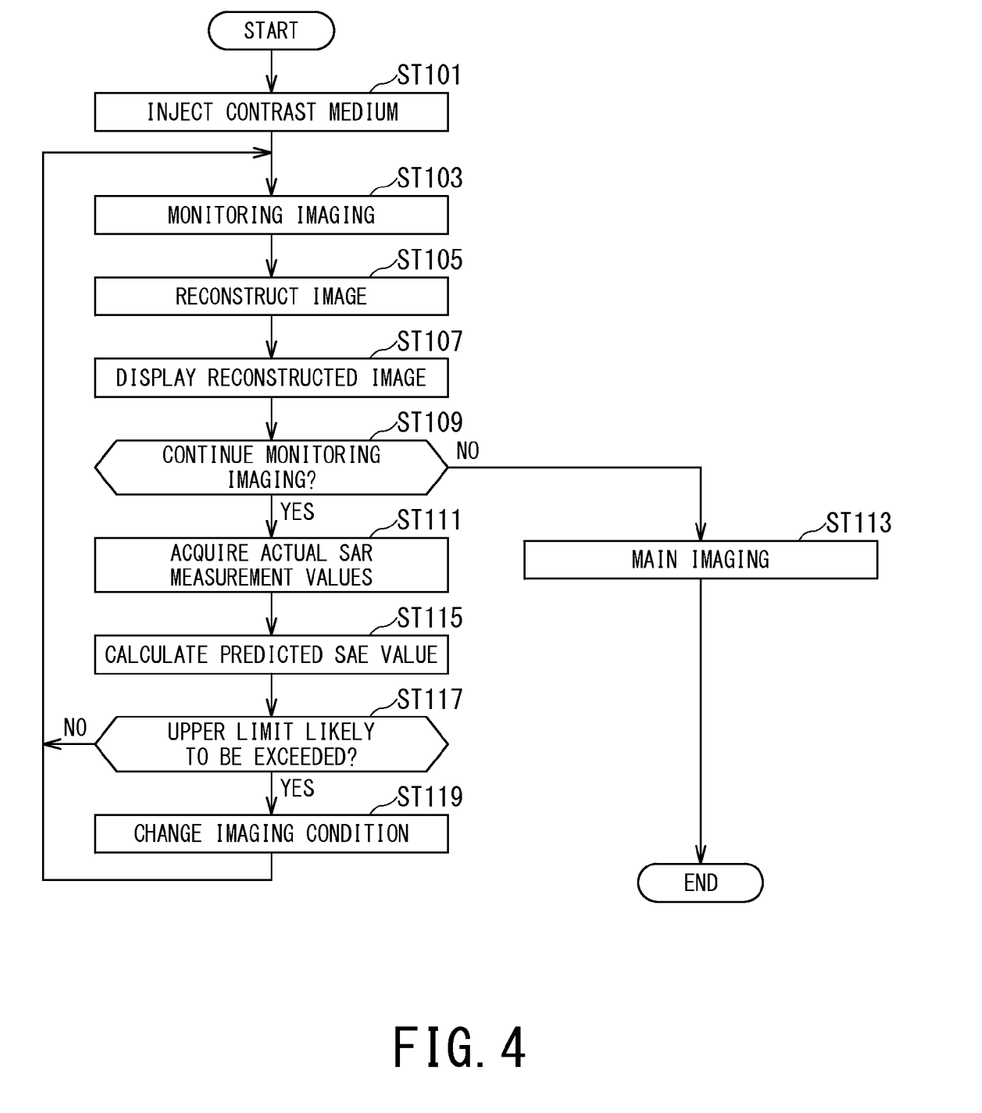
FIG. 4 is a flowchart showing an operation example of the first embodiment on the MRI apparatus according to the exemplary embodiment.

FIG. 4 is a flowchart showing an operation example of the first embodiment on the MRI apparatus 100 according to the exemplary embodiment. The first embodiment shows an example of monitoring imaging in a contrast medium examination.

In ST101, a contrast medium is injected into the subject.

In ST103, the imaging unit 8 carries out monitoring imaging.

In ST105, the image reconstruction unit 29 reconstructs an image acquired by monitoring imaging.

In ST107, a reconstructed image reconstructed by the image reconstruction unit 29 is displayed in the reconstructed-image display section 43.

The image reconstruction unit 29 applies an image calculation to data acquired by monitoring imaging according to a type of contrast medium and a state of the contrast medium inflow. The reconstructed-image display section 43 simultaneously displays plural images subjected to different image calculations.

An appropriate method is selected for the image calculations to be performed by the image reconstruction unit 29 according to the type of contrast medium and the state of contrast medium inflow. In a contrast medium examination, it is necessary to make exactly sure that the contrast medium has flown into a target region. Examples of image calculation methods used in such a case include a method which can display the inflow of the contrast medium in an easy-to-understand manner by calculating a difference between a live image acquired currently and a reference image, which is an image acquired before contrast medium injection. Also, a difference between the reference image and currently acquired image can arise due to saturation of a signal after contrast medium inflow or due to movements of the subject. To deal with such a situation, an image calculation method is available which involves updating the reference image manually or at fixed intervals.

Differential image calculation is a type of image calculation capable of exactly picking up only a signal of contrast medium inflow by extracting the difference between the reference image and live image. Differential image calculation methods also include one which more exactly picks up contrast medium inflow by taking a weighted average of calculation results or calculating a maximum value. Besides, available methods for image calculation include a method which selectively erases organs (e.g., bones and blood vessels) unnecessary for observation by masking and a method which colors an organ or tumor to be observed or the contrast medium flowing in.

Also, since contrast medium inflow changes with time, even when a same differential image calculation is performed, if the differential image calculation is performed by varying acquisition intervals of images to be subjected to the differential calculation and the images are displayed side-by-side, the user such as the surgeon can predict an inflow velocity of the contrast medium and learn arrival timing of the contrast medium at a destination more accurately.

In this way, the image reconstruction unit 29 performs image calculations necessary in order to grasp the state of contrast medium inflow precisely in a contrast medium examination. The image calculations to be performed may be determined automatically or set in advance by the user according to the type of contrast medium and/or body site of the subject to be examined. Also, an image calculation method or settings for each image calculation may be changed halfway during monitoring imaging.

In ST109, it is determined whether to continue the monitoring imaging. For example, by observing reconstructed images of monitoring imaging or differential images obtained by applying the image calculations to the reconstructed images, if the user determines that the contrast medium has flown into a target region, the user takes an action to shift from monitoring imaging to main imaging, and it is determined, based on the presence or absence of the action, whether to continue the monitoring imaging. If the monitoring imaging is to be finished, i.e., if the contrast medium has reached its destination, the monitoring imaging is stopped, and main imaging is carried out in ST113. On the other hand, if the contrast medium has not reached its destination, it is determined in ST111 to ST117 whether the upper limit has not been exceeded, and monitoring imaging is continued by returning to ST103.

In ST111, the SAR acquisition unit 21 acquires the actual SAR measurement values taken during the monitoring imaging carried out by the imaging unit 8. The acquisition interval of actual SAR measurement values for the SAR acquisition unit 21 is not particularly limited, but the actual SAR measurement values may be acquired at fixed intervals, for example, once a second.

In ST115, a predicted SAE value is calculated by the prediction unit 23. Also, a predicted value of 6-minute average SAR and predicted value of 10-second average SAR may be calculated.

The predicted SAE value, predicted 6-minute average SAR value, and predicted 10-second average SAR value are values predicted to be obtained after a lapse of a predetermined time from the present time at which the SAR acquisition unit 21 acquires the actual SAR measurement values. For example, the predicted 6-minute average SAR value changes for six minutes after the imaging condition is changed as described with reference to FIG. 3. Thus, the prediction unit 23 calculates a value expected to be obtained six minutes after the present time as the predicted 6-minute average SAR value. Also, since SAE constantly increases in proportion to time during the course of monitoring imaging if the imaging condition is constant, a SAE value after a lapse of a preset time (e.g., 10 minutes) may be predicted. The preset time may be set, for example, based on imaging time which can generally be predicted according to an imaging site and the type of contrast medium. Depending on the imaging site or the type of contrast medium, the imaging time can be predicted empirically. Using this time, SAE changes during a period from when actual SAR measurement values are acquired to when imaging is expected to be finished can be predicted. Also, a countdown of remaining imaging time may be displayed or the imaging condition may be set to be changed when the remaining imaging time reaches a predetermined level.

Figure 5:
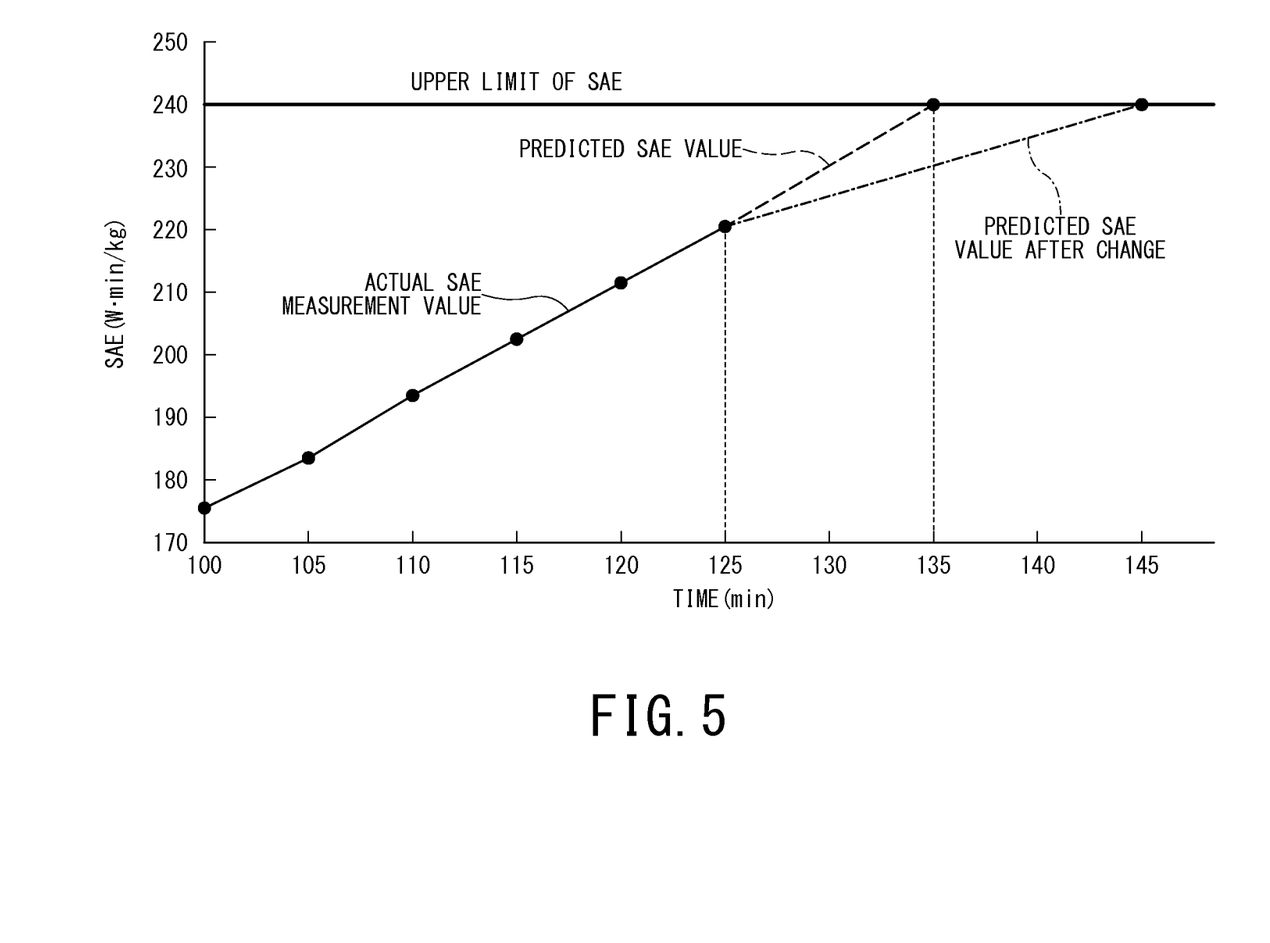
FIG. 5 is a diagram describing changes made to the imaging condition based on predicted values on the MRI apparatus according to the exemplary embodiment.

FIG. 5 is a diagram describing changes made to the imaging condition based on predicted values on the MRI apparatus 100 according to the exemplary embodiment. FIG. 5 is a SAE graph in which the ordinate represents SAE (W×min/kg) while the abscissa represents time (minutes). The graph indicated by a solid line represents actual SAE measurement values. A broken line is a graph of predicted SAE values calculated based on the actual SAR measurement values. The graph of predicted SAE values up to an elapsed time of 100 minutes is omitted in the example of FIG. 5. In the example of FIG. 5, description will be given of a determination method whereby the imaging condition changing unit 27 changes the imaging condition when the SAE upper limit is exceeded after a lapse of a predetermined time from the time of SAE measurement.

In the example of FIG. 5, 125 minutes have passed since the start of monitoring imaging. The actual SAE measurement value at the elapse of 125 minutes is indicated by a solid line in the graph of FIG. 5. The prediction unit 23 can calculate the predicted SAE value at a lapse of a predetermined time from this point in time (125-minute point), for example, at the 135-minute point after a lapse of 10 minutes. Regarding a method used by the prediction unit 23 to calculate the predicted value, the actual SAR measurement values taken at the 125-minute point may be integrated for 10 minutes or the actual SAE measurement values for 10 minutes from the 116-minute point to the 125-minute point may be added to the actual SAE measurement value taken at the 125-minute point.

In the example of FIG. 5, it can be seen that the SAE upper limit is predicted to be exceeded at the 135-minute point 10 minutes after the 125-minute point. Thus, in the example of FIG. 5, by determining that the predicted SAE value will exceed the SAE upper limit after 10 minutes, imaging condition changing unit 27 changes the imaging condition 125 minutes after the start of monitoring imaging.

In ST119 of FIG. 4, the imaging condition changing unit 27 changes the imaging condition. The post-change imaging condition may be changed by switching between preset conditions, for example, "High Power condition" and "Low Power condition", or by decreasing or increasing a predetermined imaging parameter by a predetermined ratio from the pre-change imaging condition.

Here, the high power condition is a condition under which such an RF signal that will make a flip angle larger than under the low power condition is outputted and outputted RF energy is higher than under the low power condition.

To decrease the actual SAR measurement value, it is necessary to decrease RF energy absorbed by the subject per unit time. Therefore, the imaging condition changing unit 27 changes the imaging condition to such a condition under which the RF energy will be decreased in output. The RF energy per unit time depends on imaging parameters such as the flip angle and/or a repetition time (TR). Imaging parameters selected from these imaging parameters beforehand may be set to be changed. Conversely, the imaging parameters may be changed such that the output will be decreased by a predetermined ratio.

The graph indicated by alternate long and short dashed lines in FIG. 5 shows an example in which the imaging condition is changed so as to halve the RF energy output. That is, the graph indicated by the alternate long and short dashed lines in FIG. 5 is a graph of predicted SAE values which results after the imaging condition is changed. Thus, the monitoring imaging can be continued only for 10 minutes from the 125-minute point unless the imaging condition represented by the graph of pre-change predicted SAE values indicated by the broken line in FIG. 5 is changed. On the other hand, it can be seen that if the imaging condition is changed, the imaging can be continued for up to 20 minutes thereafter.

Furthermore, based on the graph of actual SAE measurement values at the present time, it is possible to predict after how many minutes from now the upper limit of SAE will be exceeded. Such a prediction will make it possible, for example, to make a setting beforehand so that the imaging condition will be switched 10 minutes before the upper limit of SAE is exceeded.

Also, timing for changing the imaging condition can be determined using a method, such as changing the imaging condition when the actual SAE measurement value exceeds 90% the upper limit of SAE, other than a method which predicts the SAE value.

In addition, the prediction unit 23 can calculate a numeric value by adding a SAE value expected from the imaging condition of main imaging to the current SAE value. In a contrast medium examination, main imaging is required to be started immediately after the contrast medium flows into its destination. Thus, by adding the SAE value expected from the imaging condition of the main imaging to the SAE measurement value used to determine whether or not the upper limit is exceeded and using the resulting numeric value in advance, it is possible to carry out the main imaging without changing the imaging condition of the main imaging before the start of the main imaging. Also, it is possible to switch from monitoring imaging to main imaging without causing a time lag, which would occur if the imaging condition of the main imaging was revised.

Also, the imaging time can be predicted based on the imaging site for monitoring imaging and the type of contrast medium. For example, a pulse sequence is set for each imaging site, and a predicted imaging time may be stored together with the pulse sequence setting. The imaging condition changing unit 27 can use such an imaging time as a rough estimate. For example, in the example of FIG. 5, if the predicted imaging time is 145 minutes and if imaging is continued under the imaging condition set initially, it is expected that the predicted SAE value will exceed the safety standard value at the 135-minute point. Thus, the imaging condition changing unit 27 may change the imaging condition so that the predicted SAE value will not exceed the safety standard value. For example, in the case of injecting the contrast medium into the subject, there is no need to carry out imaging at high power immediately after the injection of the contrast medium compared to before and after the contrast medium reaches its destination. Therefore, using such an imaging condition immediately after the start of imaging that will produce low RF energy output, the imaging condition may be changed so as to produce high power around arrival of the contrast medium. Such an imaging time may be stored in the form of a table or the like in the storage unit 50 or the like instead of being stored together with pulse sequence settings. Also, the imaging time may be set on a hospital by hospital basis or on a user by user basis.

Figure 6:
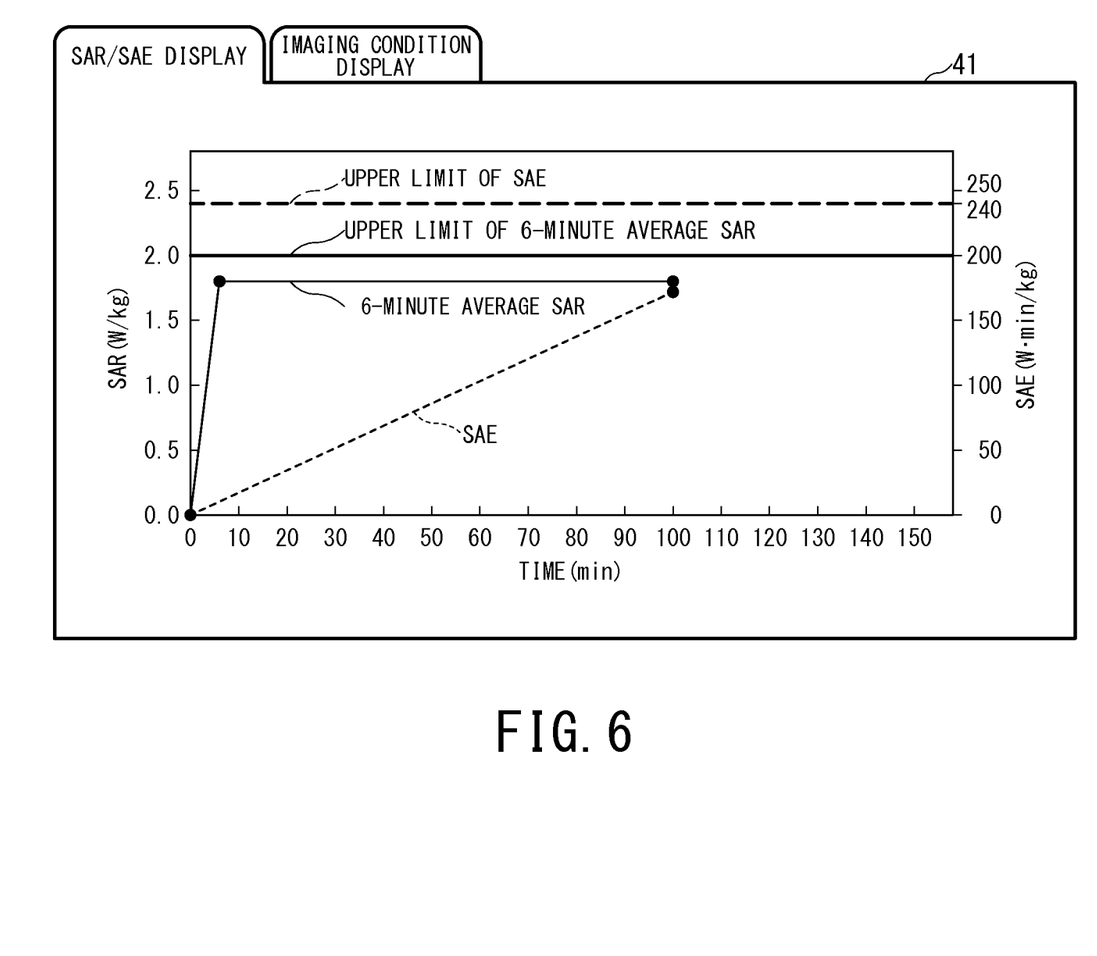
FIG. 6 is a diagram showing a first display example of average SAR and SAE on the MRI apparatus according to the exemplary embodiment.

FIG. 6 is a diagram showing a first display example of average SAR and SAE on the MRI apparatus 100 according to the exemplary embodiment. In FIG. 6, as with the graphs illustrated in FIG. 3, the abscissa represents time (minutes) and the ordinate on the left represents 6-minute average SAR (W/kg) while the ordinate on the right represents SAE (W×min/kg). In FIG. 6, a 6-minute average SAR graph is indicated by a solid line while an SAE graph is indicated by a broken line. An upper limit of the 6-minute average SAR is a value of 2.0 W/kg as indicated by the solid line and an upper limit of the SAE is a value of 240 W×min/kg as indicated by the broken line.

FIG. 6 shows graphs obtained by carrying out monitoring imaging continuously for 100 minutes. Although changes in 6-minute average SAR and SAE are represented by a same polygonal graph in the example of FIG. 6, the SAR display section 41 may display 6-minute average SAR and SAE side-by-side as separate graphs or may be configured to be able to display the two graphs by switching between them when a tab or button is pressed.

Figure 7:
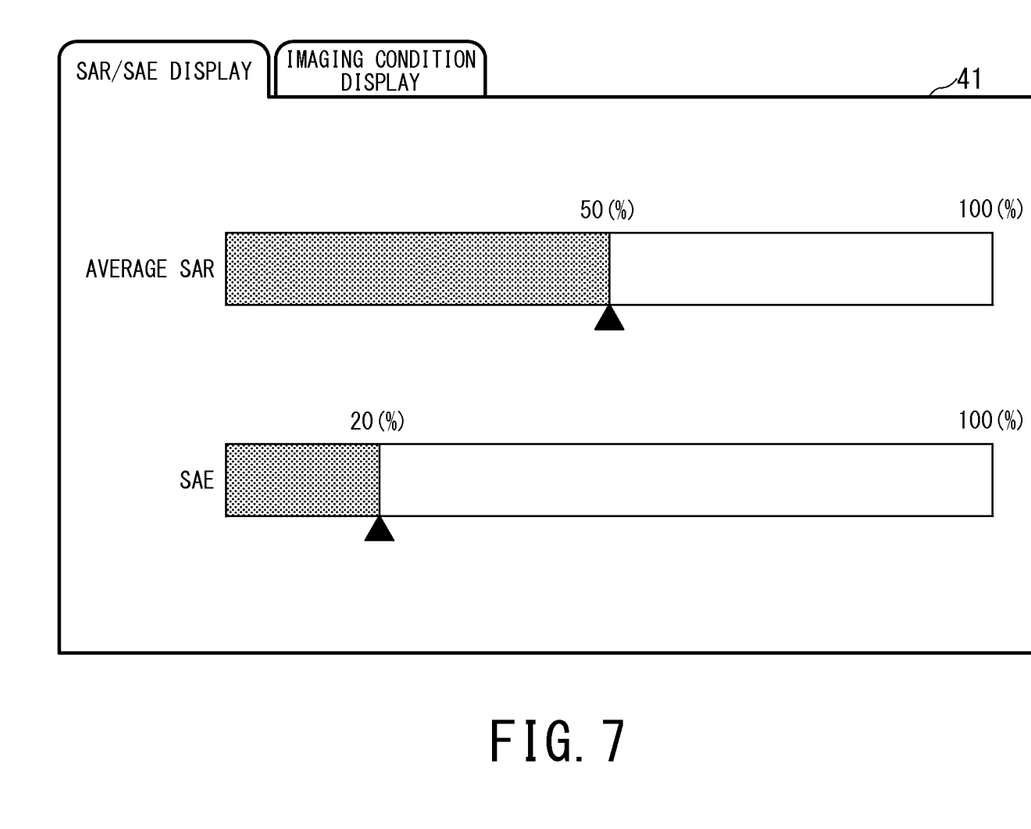
FIG. 7 is a diagram showing a second display example of average SAR and SAE on the MRI apparatus according to the exemplary embodiment.

FIG. 7 is a diagram showing a second display example of average SAR and SAE on the MRI apparatus 100 according to the exemplary embodiment. Unlike FIG. 6, FIG. 7 shows an example in which average SAR and SAE are represented by bar graphs. In the example of FIG. 7, the average SAR and SAE are represented by relative values with the respective upper limits of the average SAR and SAE taken as 100%. In FIG. 7, the bar graph in upper part represents the 6-minute average SAR and the bar graph in lower part represents the SAE. As described with reference to FIG. 3, the 6-minute average SAR varies in its value for 6 minutes from the start of imaging as well as after the imaging condition is changed. Therefore, the value of the bar graph also varies for 6 minutes, but subsequently becomes constant. When the upper limit is a value of 2.0 W/kg as in the case of FIG. 3, if the 6-minute average SAR is 1.0 W/kg when its increase stops, the relative value is 50%. Therefore, a triangular indicator attached to the bar graph moves toward a 50% point with the passage of time after the start of imaging. At the same time, a shaded region increases in area.

The actual SAE measurement value, which is an integrated value of the actual SAR measurement values, increases with the passage of time. Therefore, an indicator moves toward a 100% point with the passage of time and a shaded region increases in area as well.

The graph shown in FIG. 6 and graph shown in FIG. 7 may be displayed switchably on the SAR display section 41 when a tab is switched or may be displayed simultaneously on a same screen.

Also, to allow the imaging condition to be checked or manually changed, the imaging condition or a change screen may be displayed when a tab or button is pressed, causing a screen transition. In FIGS. 6 and 7, an "Imaging Condition Display" tab is presented. Plural imaging parameters set under the current imaging condition may be designed to be displayed when the tab is pressed. The plural imaging parameters include flip angle, repetition time (TR), and the like.

Note that the imaging condition is adjusted automatically by the imaging condition changing unit 27. The imaging condition changing unit 27 adjusts rises in SAR by adjusting the plural parameters described above. Also, adjustments can be made by switching between the "High Power Condition" and "Low Power Condition" set in advance. In that case, if the "Imaging Condition Display" tab is pressed, it is possible to display under which imaging condition the current monitoring imaging is being carried out.

Figure 8:
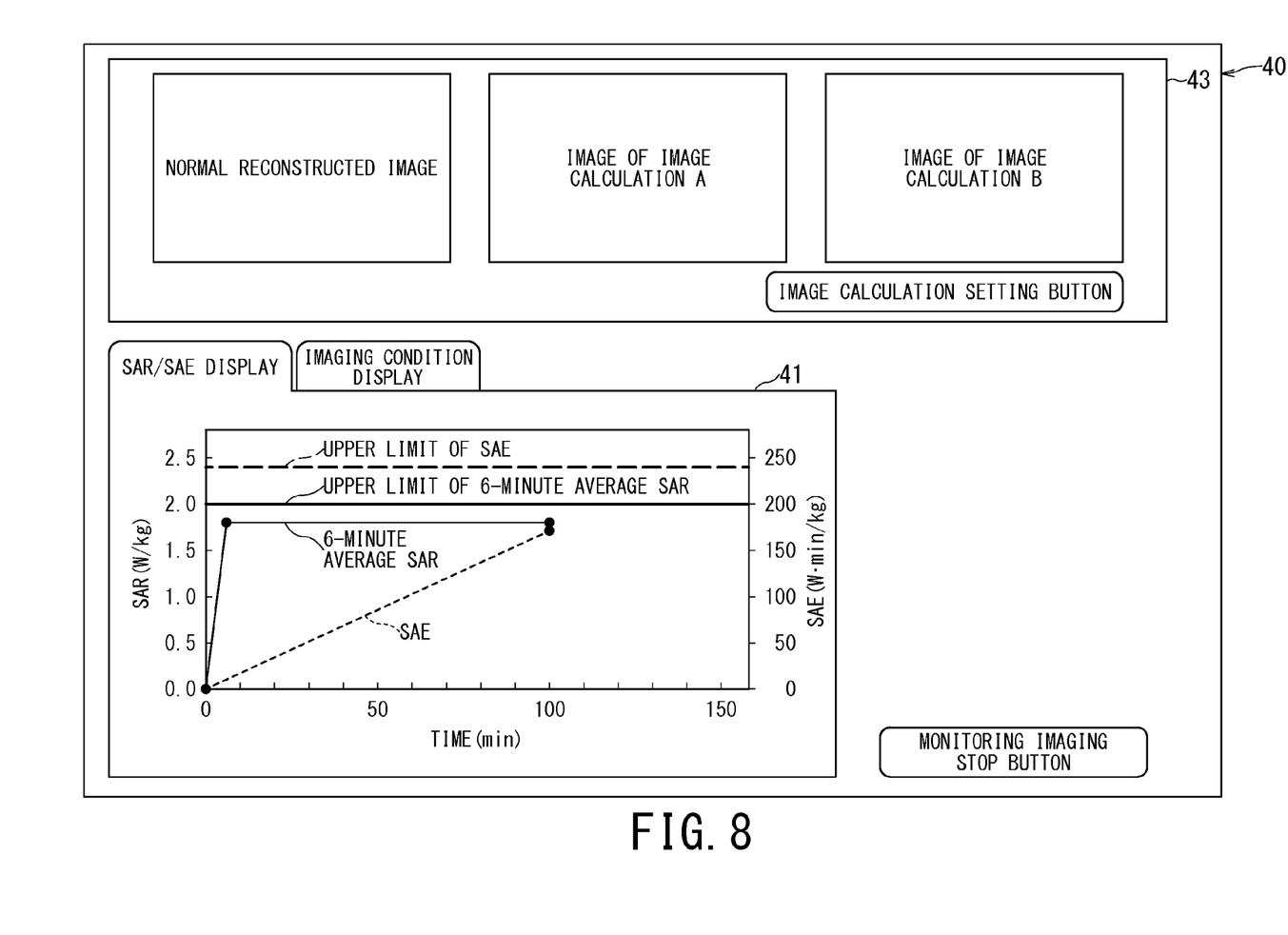
FIG. 8 is a diagram describing a display example of the reconstructed-image display section and SAR display section of the MRI apparatus according to the exemplary embodiment.

FIG. 8 is a diagram describing a display example of the reconstructed-image display section 43 and SAR display section 41 of the MRI apparatus 100 according to the exemplary embodiment. In the example shown in FIG. 8, the SAR display section 41 described with reference to FIGS. 6 and 7 and the reconstructed-image display section 43 are displayed on a same screen.

Reconstructed images subjected to image calculations by the image reconstruction unit 29 are displayed in the reconstructed-image display section 43 of FIG. 8. The example of FIG. 8 shows a "Normal Reconstructed Image", an "Image of Image Calculation A", and an "Image of Image Calculation B" from left to right. For example, when a contrast medium is injected, an image subjected to a normal differential image calculation ("Image of Image Calculation A") and an image subjected a differential image calculation with a contrast medium inflow signal enhanced by weighted averaging ("Image of Image Calculation B") may be displayed together with a normal reconstructed image.

An "Image Calculation Setting Button" for use to change image calculation settings may be displayed below the reconstructed images displayed in the reconstructed-image display section 43 of FIG. 8, the "Image Calculation Setting Button", when pressed, allows various setting changes to be made, including changing the type of the image calculations, changing a reference image for differential image calculations, selecting an update interval of the reference image, and selecting a reconstruction interval (frame rate) of the image to be displayed.

Also, in the example of FIG. 8, the SAR display section 41 shown in FIGS. 6 and 7 is displayed in a lower part of the reconstructed-image display section 43 at the same time. In this way, since the reconstructed-image display section 43 and the SAR display section 41 can be viewed simultaneously, the user intending to verify inflow of the contrast medium can verify rises in SAR without taking other actions such as changing the screen.

Furthermore, a "Monitoring Imaging Stop Button" is provided to the right of the SAR display section 41 in FIG. 8. The button may be designed such that a press of the button will allow main imaging to be carried out by finishing monitoring imaging.

Also, immediately after an imaging condition is changed, differential image display changes suddenly. For example, acquired images differ between when imaging is carried out under an imaging condition of high RF energy and when imaging is carried out under an imaging condition of low RF energy. The differential image calculation is image processing for extracting a difference between a reference image and live image. However, a live image before a condition change and a live image after the condition change differ in image quality, and consequently, image quality differs between differential images generated from respective live images as well. Thus, when the imaging condition is changed, an image calculation process which will curb influence of the imaging condition change may be performed, for example, by obtaining a weighted average of the live image before the imaging condition change and the live image after the imaging condition change.

Such image calculations provide an easily viewable display and allow the user to appropriately determine inflow timing of the contrast medium and the like.

(Second Embodiment)

Figure 9:
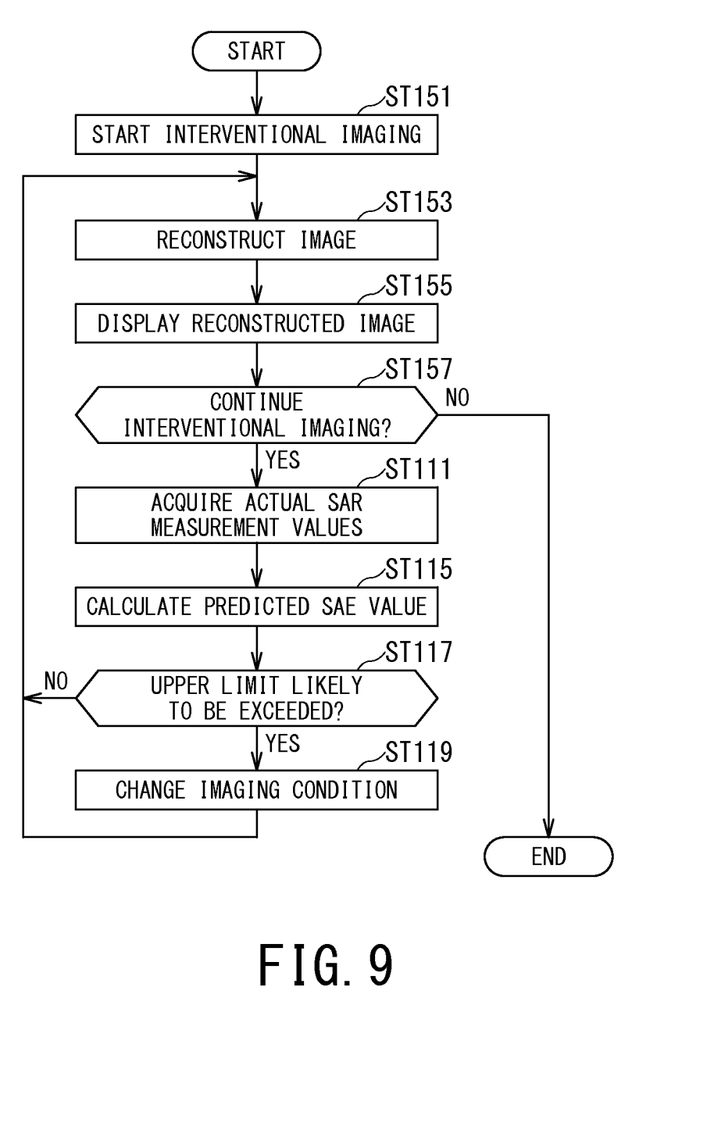
FIG. 9 is a flowchart showing an operation example of the second embodiment on the MRI apparatus according to the exemplary embodiment.

FIG. 9 is a flowchart showing an operation example of the second embodiment on the MRI apparatus 100 according to the exemplary embodiment. The second embodiment is an example in which interventional imaging is carried out. Note that in FIG. 9 differences from the first embodiment will only be described. In FIG. 9, steps in common with the flowchart of the first embodiment in FIG. 4 are denoted by the same step numbers as the corresponding steps in FIG. 4.

In ST151, the imaging unit 8 starts interventional imaging. The interventional imaging is an imaging method for sequential imaging, is used in performing medical treatments such as insertion of a catheter or puncture needle, placement of a stent, or insertion of an endoscope, and is carried out while displaying reconstructed images intended to clearly locate orientation and depth of the instrument in the body of the subject in order to deliver such an instrument to a targeted body site or a tumor treatment site in the subject.

In ST153, the image reconstruction unit 29 reconstructs an image. With the interventional imaging, by inserting an instrument such as a catheter, puncture needle, stent, or endoscope into the body of the subject and moving the instrument to a desired region, a medical procedure such as removal of a tumor or placement of the stent in blood vessel is carried out. Therefore, it is important that the orientation and depth of the instrument inserted into the body of the subject be clearly located through image calculations and displayed on the display unit 40. Thus, in some cases, interventional imaging uses an image calculation which calculates, for example, a traveling direction, depth, trajectory, and the like of the instrument on the obtained reconstructed image and displays results using colors, shading, and the like. Furthermore, interventional imaging sometimes uses an image calculation which is intended for the purpose of three-dimensional display as well as for the purpose of grasping anteroposterior relations of blood vessels and organs.

Among the image calculations described above, the image reconstruction unit 29 may automatically detect an appropriate image calculation according to the type of medical procedure to be performed under interventional imaging or allow the user to specify an appropriate one in advance. Also, an image calculation method or settings for each image calculation may be changed halfway during interventional imaging.

In ST155, the reconstructed image is displayed on the reconstructed-image display section 43. Regarding the display, as with FIG. 8 described in the first embodiment, plural images subjected to different image calculations, such as a "Normal Reconstructed Image", an "Image of Image Calculation A", and an "Image of Image Calculation B" may simultaneously be displayed from left to right. For example, when a catheter is inserted into the body of the subject, an image subjected to an image calculation which calculates the traveling direction, depth, trajectory, and the like of the catheter and displays results using colors, shading, and the like ("Image of Image Calculation A"), and an image subjected to an image calculation which is intended for the purpose of three-dimensional display as well as for the purpose of grasping anteroposterior relations of blood vessels and organs ("Image of Image Calculation B") may be displayed together with a normal reconstructed image. Also, two images differing in projected profile may be displayed together with the "Image of Image Calculation A" and "Image of Image Calculation B".

In ST157, it is determined whether to continue the interventional imaging. If the interventional imaging is not going to be continued, i.e., if the medical procedure is completed, the interventional imaging is stopped.

On the other hand, if the interventional imaging is going to be continued, it is determined in ST111 to ST117 whether the upper limit is likely to be exceeded. If the upper limit is likely to be exceeded, the imaging condition is changed in ST119. Steps ST111 to ST119 are carried out in a same manner as described in the first embodiment.

In ST117 of FIG. 9, the determination as to the upper limit is made by taking subsequent main imaging into consideration, and also in the case of interventional imaging, even if the instrument reaches a desired region and purposes of the medical procedure are achieved, it is sometimes necessary to subsequently remove the instrument and verify that bleeding has stopped. The type of post-treatment administered after achieving the purposes of such a medical procedure varies with the type of medical procedure and the like. Thus, if according to the type of medical procedure to be carried out, SAE values taken for a duration corresponding to the time required to administer a predetermined post-treatment is added to the actual SAE measurement value used to determine timing to change the imaging condition, some leeway can be provided.

In this way, during monitoring imaging carried out in a contrast medium examination or during interventional imaging carried out simultaneously with a medical procedure, the present invention can change an imaging condition by detecting timing to automatically change the imaging condition based on numeric values predicted from actual measurement values, such that the average SAR of the subject and SAE will fall below their respective upper limits. In carrying out sequential imaging, this makes it possible to avoid a situation in which the imaging has to be stopped halfway during an examination or medical procedure due to rises in body temperature of the subject. Furthermore, since the imaging condition is changed automatically when average SAR and SAE are likely to reach the upper limits, the user is saved the trouble of adjusting the complex imaging condition manually and can concentrate on verifying injection of the contrast medium and carrying out a medical procedure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
MRI system components including static and gradient magnetic field generators, at least one radio frequency (RF) coil coupled to an imaging volume, RF transmitter and receiver circuits and at least one processor connected to control said components and configured to execute a sequential plurality of MRI procedures;
acquire an actual specific absorption ratio (SAR) measurement value when a first imaging procedure is executed;
predict a specific absorbed energy (SAE) value when an actual SAR measurement value is acquired, the predicted SAE value being based on an anticipated second imaging procedure that is to be performed subsequent to the first imaging procedure; and
change an MRI condition for the second imaging procedure based on the predicted SAE value.

2. The MRI apparatus according to claim 1, wherein said MRI system components include an operator display and said at least one processor is further configured to
display the actual SAR measurement value and the predicted SAE value each time the actual SAR measurement value and the predicted SAE value are acquired and predicted, respectively.

3. The MRI apparatus according to claim 1, wherein the at least one processor is also configured to change the MRI condition to a high RF power condition or a low RF power condition that have been set in advance.

4. The MRI apparatus according to claim 1, wherein the at least one processor has also been configured to change at least one predetermined MRI condition parameter among a plurality of parameters by a predetermined ratio according to the predicted SAE value.

5. The MRI apparatus according to claim 1, wherein the at least one processor has also been configured to calculate the predicted SAE value according to a type of medical treatment carried out during the plural sequential MRI procedures or an anatomical portion subjected to the sequential MRI procedures.

6. A magnetic resonance imaging (MRI) apparatus comprising:
MRI system components including static and gradient magnetic field generators, at least one radio frequency (RF) coil coupled to an imaging volume, RF transmitter and receiver circuits and at least one processor connected to an operator display and control said components, said at least one processor being configured to execute a sequential plurality of MRI procedures which acquire respectively corresponding reconstructed images that are subjected to a predetermined image calculation;

display images subjected to the predetermined image calculation; and change an imaging condition during a first imaging procedure, wherein the predetermined image calculation is changed for an image acquired from a second imaging procedure subsequent to the first imaging procedure, and display the image acquired from the second imaging procedure after having been subjected to the changed predetermined image calculation.

7. A magnetic resonance imaging (MRI) method comprising:

using an MRI system components including static and gradient magnetic field generators, at least one radio frequency (RF) coil coupled to an imaging volume, RF transmitter and receiver circuits and at least one processor connected to control said components to execute a sequential plurality of MRI procedures;

acquire an actual specific absorption ratio (SAR) measurement value when a first imaging procedure is executed;

predict a specific absorbed energy (SAE) value when an actual SAR measurement value is acquired, the predicted SAE value being based on an anticipated second imaging procedure that is to be performed subsequent to the first imaging procedure; and change an MRI condition for the second imaging procedure based on the predicted SAE value.

8. The MRI method according to claim 7, wherein said MRI system components are used to display the actual SAR measurement value and the predicted SAE value each time the actual SAR measurement value and the predicted SAE value are acquired and predicted, respectively.

9. The MRI method according to claim 7, further comprising changing the MRI condition to a high RF power condition or a low RF power condition that have been set in advance.

10. The MRI method according to claim 7, further comprising changing at least one predetermined MRI condition parameter among a plurality of parameters by a predetermined ratio according to the predicted SAE value.

11. The MRI method according to claim 7, further comprising calculating the predicted SAE value according to a type of medical treatment carried out during the plural sequential MRI procedures or an anatomical portion subjected to the sequential MRI procedures.

* * * * *